United States Patent [19]

Martin

[11] Patent Number: 5,278,997
[45] Date of Patent: Jan. 11, 1994

[54] DYNAMICALLY BIASED AMPLIFIER

[75] Inventor: William J. Martin, Fort Lauderdale, Fla.

[73] Assignee: Motorola, Inc., Schaumburg, Ill.

[21] Appl. No.: 32,743

[22] Filed: Mar. 16, 1993

Related U.S. Application Data

[63] Continuation of Ser. No. 628,812, Dec. 17, 1990, abandoned.

[51] Int. Cl.⁵ .............................................. H04B 1/04
[52] U.S. Cl. .................................... 455/127; 330/127; 330/133
[58] Field of Search ............... 455/114, 116, 119, 126, 455/127, 311; 330/127, 129, 130, 296, 133

[56] References Cited

U.S. PATENT DOCUMENTS

| | | | |
|---|---|---|---|
| 3,740,670 | 6/1973 | Hoffman | 330/103 |
| 4,464,633 | 8/1984 | Harwood et al. | 330/133 X |
| 4,465,670 | 8/1984 | Huang et al. | 330/277 |
| 4,549,138 | 10/1985 | Suzuki | 324/309 |
| 4,592,073 | 5/1986 | Watanabe | 455/126 |
| 4,644,293 | 2/1987 | Kennett | 330/296 |
| 5,087,893 | 2/1992 | Peterson et al. | 330/296 |
| 5,196,806 | 3/1993 | Ichihara | 455/127 X |

Primary Examiner—Reinhard J. Eisenzopf
Assistant Examiner—Edward Urban
Attorney, Agent, or Firm—Pedro P. Hernandez

[57] ABSTRACT

An amplifier (102) which can be dynamically biased is disclosed. A controller (118) determines when to change the bias to the amplifier (102), in order to achieve low frequency splatter. This is accomplished by changing the bias level of amplifier (102) between a substantially linear (class A) mode of operation, and a substantially nonlinear (class B) mode of operation. During the critical periods when the amplifier (102) is being turned into and out of operation, the amplifier (102) is placed in a substantially linear mode of operation, thereby reducing the output harmonics which develop. In another aspect of the invention a radio 300 which employs a dynamically biased amplifier (102) is disclosed.

8 Claims, 3 Drawing Sheets

DYNAMICALLY BIASED AMPLIFIER

This is a continuation of application Ser. No. 07/628,812, filed Dec. 17, 1990, and now abandoned.

TECHNICAL FIELD

This invention relates to electronic amplifiers, and more specifically to a dynamically biased amplifier for use in communication devices.

BACKGROUND

In communication devices such as battery powered two way portable radios, there is a great need for power amplifiers which exhibit high operating efficiencies, and low current drain characteristics. This is due to the limited amount of battery capacity available in portable radios, combined with the increasing demands by radio users to operate radios for longer periods of time without recharging the batteries. Since the power amplifiers used in radios are one of the key current consuming devices of a radio, there is always a need for higher efficiency amplifiers in radio designs. Unfortunately, power amplifiers which exhibit high efficiencies such as "Class B" amplifiers, tend to have problems with what is known as frequency splatter, due to the fact that a Class B amplifier will turn on very quickly (as soon as an input signal to the amplifier is applied which is high enough to bias the amplifier). This high speed turn on and off operation of the amplifier causes frequency harmonics to be transmitted which are undesired. Unwanted harmonics are especially a problem in time division multiplexing (TDM) communication equipment due to the high rate of operation of the transmitter, which contributes to greater harmonic problems. Frequency splatter not only causes interference with the transmitted signal, but also causes problems in meeting regulatory agency requirements (e.g. FCC, etc.) that most countries impose on communication equipment.

A need for a high efficiency amplifier circuit which can attain high efficiencies, as well as exhibit minimal frequency splatter would be very useful for use in communication equipment, and would be especially useful in TDM applications. A bias circuit which could take the high efficiency amplifier characteristics of a Class B amplifier or other high efficiency amplifier class, and give it the low splatter characteristics of a class A amplifier (or other similar low splatter class) would be very beneficial in minimizing the problems associated with frequency splatter.

SUMMARY OF THE INVENTION

Briefly, according to the invention, an amplifier that can adjust its bias level is disclosed. The amplifier comprises at least one amplifier stage for receiving an input signal and providing an output signal. The amplifier also has a control means coupled to the at least one amplifier stage for adjusting the bias level of the amplifier. In another aspect of the invention the amplifier operates alternatively in a substantially linear mode in one bias level and a substantially non-linear mode in a second bias level.

A radio comprising a transmitter having an amplifier which is capable of adjusting its bias level is also disclosed. In another aspect of the invention the radio is a time division multiplexed (TDM) radio.

DETAILED DESCRIPTION OF THE PREFERRED EMBODIMENT

Figure 1:
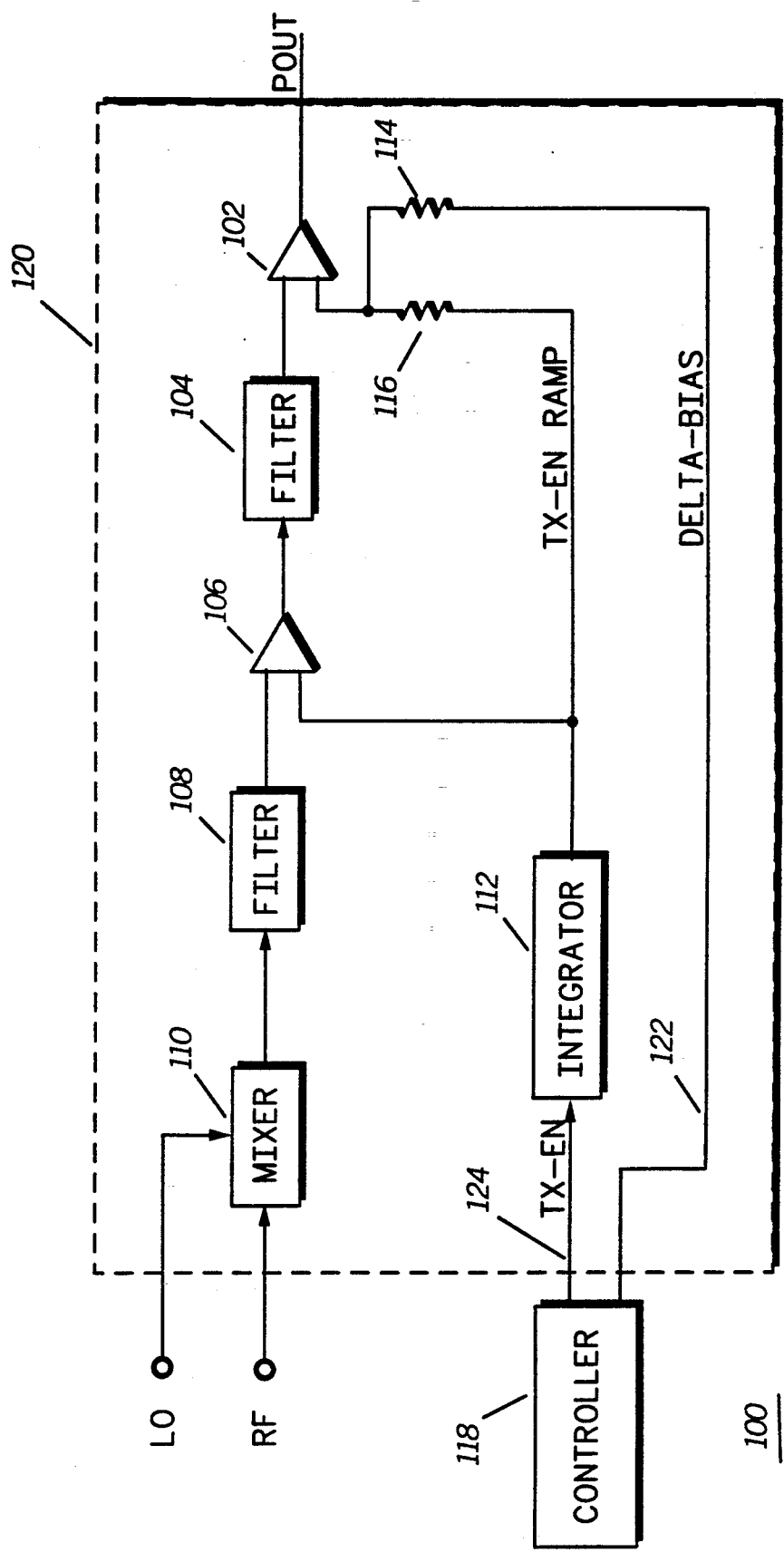
FIG. 1 is a diagram of a amplifier circuit in accordance with the present invention.

In FIG. 1, a drawing of an amplifier circuit 100 in accordance with the present invention is shown. The circuit 100 comprises an amplifier 102 which is preferably a radio frequency power amplifier, such as is used in radio communication applications. Although the preferred embodiment will be discussed as a radio frequency (RF) amplifier, other types of amplifiers circuits such as those used in audio, and power applications can also be implemented with the present invention. Coupled to the input of amplifier 102 is band pass filter section 104 which is used to filter the radio frequency signal before it reaches the input of the final amplifier 102. Preferably, circuit 100 includes a preamplifier 106 such as those commonly used in two-way radios. The output of preamplifier 106 is coupled to filter 104, and is primarily used to increase the gain of the radio frequency signal which is applied to amplifier 102. Preamplifier 106 also has a filter section 108 at its input to reduce or prevent unwanted signals from reaching the preamplifier 106. Coupled to filter 108 is mixer 110 which mixes the radio frequency (RF) signal being generated by the front end of the transmitter with a local oscillator signal (LO), the mixed signal output is applied to the input of filter 108.

Circuit 100 also includes a control means such as controller 118. The control means can be anyone of a number of microprocessors or microcontrollers which are available such as a MC68HC11A8 microcontroller, having on-chip memory, control circuitry, timing circuitry, etc. Controller 118 could also be designed using discrete and integrated circuits as known in the art. A timing means inside of controller 118, determines when to change the bias conditions of both the preamplifier 106, and amplifier 102 in order to minimize unwanted radio frequency splatter from being emitted by rf amplifier 102. Output line 122 of controller 118, labeled DELTA-BIAS in the diagram, is connected via series resistor 114 to amplifier 102. The DELTA BIAS line 122 is primarily used to change the bias level of amp 102, with the bias level being modified by controlling the amount of current being provided to amp 102. A second output line 124 (labeled TX-EN) is connected to an integrator 112 which is in turn connected to preamplifier 106 and, via series resistor 116, to amp 102. Both series resistors 116, and 114 are designed to limit the amount of current flowing into amp 102 from output lines 124, and 122 in order to bias both devices. Integrator 112 is employed in generating a ramp function over time (increasing or decreasing current drive level), from the signal that is outputted via line 124 (labeled TX-EN). The increasing (or decreasing) current bias (TX-EN RAMP) flows into both preamp 106, and amp 102 in order to adapt the bias of both devices. The section comprising the preamp 106, amp 102, and the other related components is referred to as the delta bias section 120.

Figure 2:
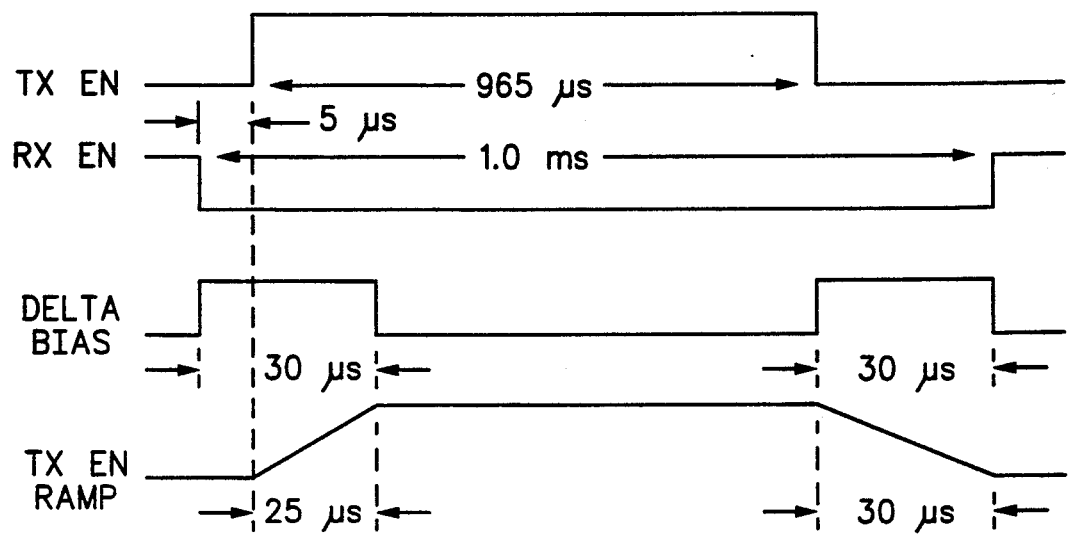
FIG. 2 is a timing diagram showing the control signals for the amplifier of FIG. 1.

In FIG. 2, a timing diagram in accordance with the present invention is shown. The top most timing line labeled TX EN shows the period of time (signal high) when radio 300 (shown in FIG. 3) is transmitting. In this embodiment, the length of transmission is approximately 965 microseconds. In the preferred embodiment, radio 300 is a time division multiplexed (TDM) radio, which is well suited for the benefits of the present invention due to the high transmit duty cycles found in TDM radios. The second timing line labeled RX EN shows when radio 300 is receiving information (signal high), and when it is not receiving information (signal low), which is shown here to be approximately 1 millisecond in the non-receiving mode. When RX EN is low, mixer 110 is turned on, which delivers low level rf through filter 108 to the input of preamplifier 106. The RF drive signal is present at the input of preamp 106 before the TX EN RAMP bias level turns preamplifier 106 on.

The third timing line is the DELTA BIAS line and it is the timing of the bias level applied to amp 102 via controller 118. As can be seen the delta bias level goes high for a time interval of approximately 30 microseconds as soon as the radio 300 has completed receiving information. Since the time between receiving information and transmitting information signals is 5 microseconds, the bias level to amp 102 will be at the delta bias level (first bias level) prior to amp 102 beginning to transmit the RF signal. The time interval in which the DELTA BIAS signal is high is the first bias level. By having amp 102 biased at the first bias level before going into operation, frequency splatter is minimized, due to the fact that the first bias level places amp 102 in a substantially linear mode of operation. This is similar to placing amp 102 in a traditional class A mode of operation or other linear class of operation. Since class A amplifiers have the advantage of producing low levels of harmonics upon turn on, frequency splatter is held to a minimum when radio 300 commences transmission.

At the same time that radio 300 begins to transmit, the second output line 124 from controller 118 begins to place a second bias level generated by integrator 112 (TX EN RAMP) onto both the preamp 106, and amp 102. Integrator 112 (FIG. 1) changes the bias level into a ramp function as seen in FIG. 2. By placing a slowly rising bias level onto preamp 106, the input signal being applied to amp 102 is gradually rising in level, thereby minimizing output splatter of amp 102 even further. By the time the TX-EN RAMP has reached an approximately constant level (the second bias level), the first bias level (DELTA BIAS) time interval (first bias level) has dropped in value after expiration of the 30 microsecond time interval.

Since both the first and second bias level lines (DELTA BIAS and TX EN RAMP) are connected to amp 102, the amp is left at the second bias level after the DELTA BIAS has expired. This level is chosen in order to place amp 102 in a substantially nonlinear mode of operation. By placing amp 102 in a nonlinear mode or high efficiency mode, current savings are maximized during the time that frequency splatter problems are minimized (once amp 102 is out of the transient turn on state, and has begun to transmit). Biased at the second bias level, amp 102 acts like a class B amplifier whose bias level is determined by the RF drive to amp 102. Amp 102 stays in this second bias level until radio 300 finishes its transmission (TX EN goes low) at which point the first bias level (DELTA BIAS) goes high placing amp 102 back to a substantially linear mode of operation. At the same time, the second bias level is slowly reduced in level, further minimizing frequency splatter problems associated with the turning off of amp 102.

In a TDM radio, like radio 300, these dynamic bias level changes help to reduce the otherwise great amounts of harmonics which would be generated by amp 102. This same concept of adapting the bias level during the transient periods of amplifier operation can be employed in almost any amplifier where frequency or distortion problems are associated with the transient operation of the amplifier. Although specific time intervals have been shown, those skilled in the art will appreciate that these intervals can be modified depending on specific design needs. Just as well the relationship of the bias levels to each other can also be modified in order to achieve specific results in the overall design.

Figure 3:
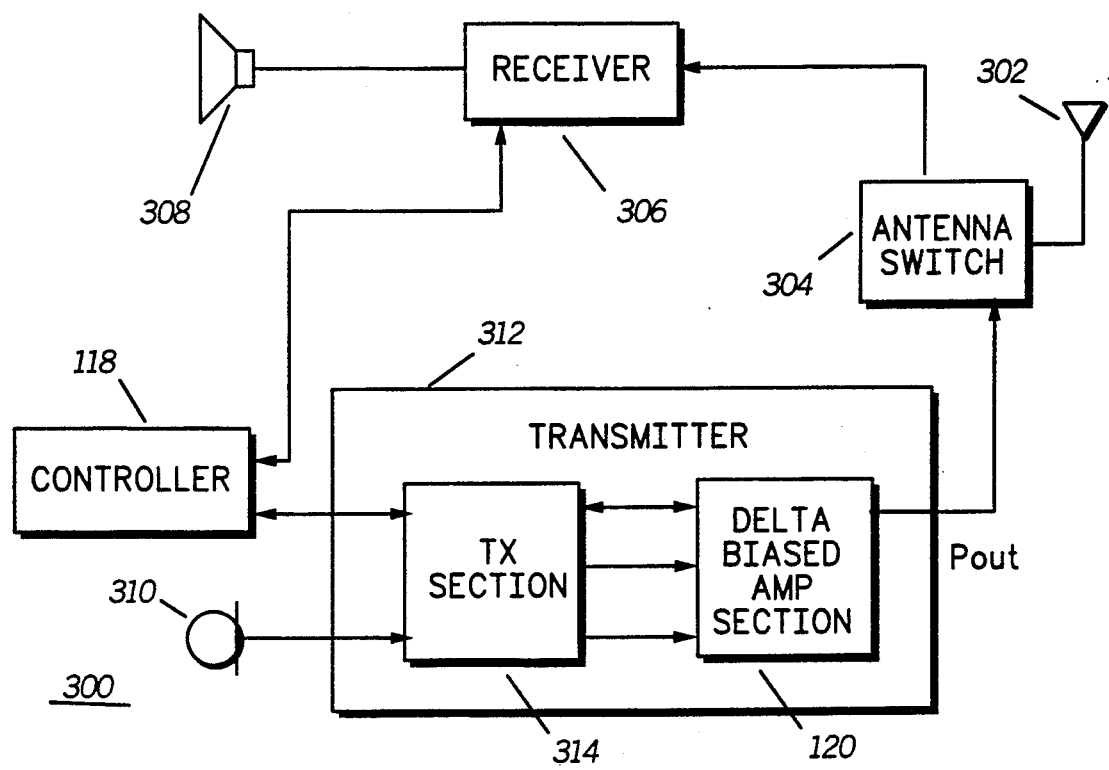
FIG. 3 a schematic of a radio in accordance with the present invention.

In FIG. 3 a radio 300 is shown, preferably radio 300 is a time division multiplexed radio as similar to those known in the art. Radio 300 comprises a receiver 306 used for receiving information signals, and a transmitter 312, used to transmit information. Transmitter 312 comprises the delta biased amp section 120 as discussed above, also part of transmitter 312 is section 314 which is the balance of the circuitry which makes up conventional RF transmitter 312. Both receiver 306 and transmitter 312 are selectively coupled to antenna 302 via antenna switch 304. A speaker 308 is connected to receiver 306 for presentation of audio signals received by receiver 306. Microphone 310 is connected to transmitter 312, and allows voice messages to be transmitted via transmitter 312. Radio 300 is also capable of data transmissions, the method of transmission (voice/data) being dependent on the application the radio 300 is used for.

Controller or control means 118 is coupled to both the receiver 306, and transmitter 312, and controls the operation of both devices. In a TDM radio, like radio 300, the controller 118 controls when the radio receives and transmits. For the purposes of the present invention, controller 118 controls the bias of the amplifiers in the delta biased amp section 120. By knowing exactly when the radio 300 is transmitting and receiving, controller 118 decides when to adapt the bias levels of the amplifiers, especially the level for amplifier 102. Controller 118 primarily initializes amplifier 102 to a first bias level, and adapts the amplifier 102 to a second bias level when required. Controller 118 can also include current drive circuitry in order to drive the current required (first bias level) to bias amplifier 102.

Figure 4:
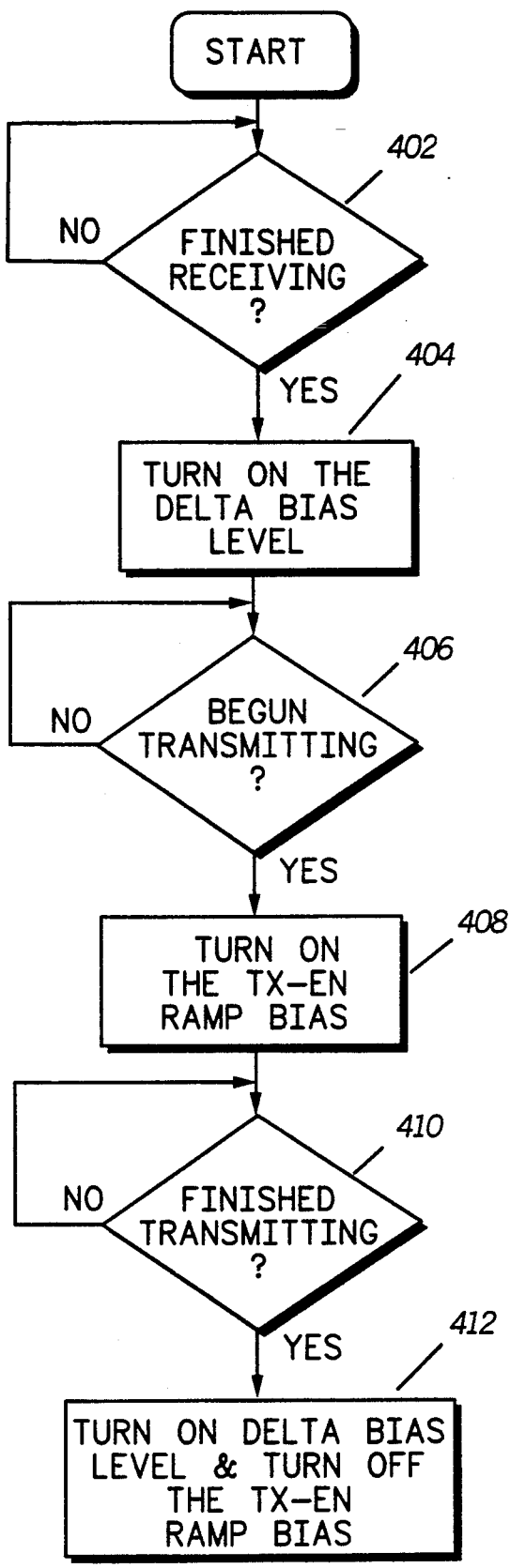
FIG. 4 a flowchart showing the typical biasing sequence of the amplifier of FIG. 1.

In FIG. 4, a flowchart showing the typical biasing sequence for the amplifiers is shown. In step 402, the controller 118 decides if the receiver 306 has finished receiving, if yes, in step 404 the controller 118 sends via line 122 a first bias level (DELTA BIAS) for a predetermined time interval. In this case the time interval used is 30 microseconds, but the time can be varied depending on the type of radio, and signalling scheme being utilized. By minimizing the DELTA BIAS or first bias level to a short duration of time, the amp 102 receives the benefit of a substantially linear operation mode during the time the amplifier is turned on into operation, while the overall current drain in driving amp 102 is minimized.

In step 406, controller 118 determines if the transmitter has begun transmitting, in this embodiment the controller would know that the transmitter would begin transmitting 5 microseconds after the receiver has finished receiving. Once it is determined that the radio 300 has begun transmitting, the second bias line 124 is activated (TX EN) which sends a bias to integrator 112 which generates a positive ramping bias (TX EN RAMP) to both amp 102 and preamp 106 (step 408). Once the TX EN RAMP reaches a substantially constant level (referred to as the second bias level) approximately 25 microseconds later, the time interval for the DELTA BIAS has expired. At which point the preamp 106 and amp 102 are operated at this second bias level throughout the remainder of the transmission cycle. In step 410, the controller determines if the radio 300 has finished transmitting, and if so, in step 412, sends another first bias level (DELTA BIAS) to amp 102, in order to place amp 102 in a substantially linear mode during the turn off of the amp 102 (transmission completed) for the predetermined time interval (30 µs). At approximately the same time the second bias level is brought down in level with a negative ramping level which is accomplished by integrator 112 from the signal coming from output line 124 of controller 118. Once this step is completed, the whole cycle is repeated with the bias level to the amplifiers being modified before the transmission, and as soon as transmission sequence has ended.

As can be seen by one skilled in the art the present invention solves the problems that low current drain amplifier designs (e.g. class B, C, or E amplifiers, etc.) have with frequency splatter due to the rapid turn on and off of the amplifiers. By being able to place the amplifier in a substantially linear operating mode (substantially class A operation, or another linear operating class) during the critical turn on, and turn off times (transient times) of amplifier 102, frequency splatter is minimized. Since the time the amplifier is in the first bias state (DELTA BIAS) is very short as compared to the total transmission cycle, very little additional current is utilized to set amp 102 in the linear mode. The tradeoff is worthwhile since detrimental frequency splatter (harmonics) are reduced substantially. Other savings are also realized in the fact that frequency splatter is minimized without the use of additional output filtering for amp 102, which not only increases the product cost of radio 300 but also takes up valuable space.

While the present invention has been described with specific embodiments, it is evident that many alternatives, modifications, and variations will be apparent to those skilled in the art in light of the foregoing description. Accordingly, it is intended that the present invention embrace all such alternatives, modifications, and variations as fall within the spirit and scope of the appended claims.

What is claimed is:

1. An amplifier, comprising:
a preamplifier stage having an output terminal;
an amplifier stage for receiving an input signal from the preamplifier's output terminal and providing an output signal; and
a control means coupled to the amplifier and preamplifier stages for initializing the amplifier stage to a first bias threshold level with a first bias signal before the amplifier stage provides the output signal, the control means further providing a second bias signal to the preamplifier and amplifier stages a predetermined time after providing the first bias signal to the amplifier stage, the amplifier stage provides the output signal in response to the second bias signal, the second bias signal increasing in bias level until it reaches a second bias threshold level which causes the control means to remove the first bias signal from the amplifier stage.

2. An amplifier as defined in claim 1, wherein the amplifier stage operates in a substantially linear mode when in the first bias threshold level, and in a substantially non-linear mode when in the second bias threshold level.

3. An amplifier as defined in claim 1, wherein the control means further comprises:
an integrator coupled to the pre-amplifier and amplifier stages for providing the second bias signal.

4. A radio capable of transmitting information, comprising:
a preamplifier stage having an output terminal;
an amplifier stage for receiving an input signal from the preamplifier's output terminal and providing an output signal; and
a control means coupled to the amplifier and preamplifier stages for initializing the amplifier to a first bias threshold level with a first bias signal before the amplifier stage provides the output signal, the control means further providing a second bias signal to the preamplifier and amplifier stages a predetermined time after providing the first bias signal to the amplifier stage, the amplifier stage provides the output signal in response to the second bias signal, the second bias signal increasing in bias level until it reaches a second bias threshold level which causes the control means to remove the first bias signal from the amplifier stage.

5. A radio as defined in claim 4, wherein the radio is a time division multiplexed (TDM) radio.

6. A radio as defined in claim 4, wherein the amplifier stage operates in a substantially linear mode when in the first bias threshold level, and in a substantially non-linear mode when in the second bias threshold level.

7. A method for dynamically biasing an amplifier having an amplifier stage and a preamplifier stage, the amplifier providing an output signal, comprising the steps of:
biasing the amplifier stage to a first bias threshold level with a first bias signal prior to the amplifier providing the output signal;
applying a second bias signal which is increasing in bias level to the amplifier stage and to the preamplifier stage substantially upon the amplifier beginning to provide the output signal; and
removing the first bias signal which is being applied to the amplifier stage upon the second bias signal reaching a second bias threshold level.

8. A method for dynamically biasing an amplifier as defined in claim 7, further comprising the step of:
reapplying the first bias signal to the amplifier stage upon no output signal being provided by the amplifier; and
gradually reducing the second bias signal over a predetermined period of time upon the first bias signal being reapplied.

* * * * *